United States Patent [19]

Lawton

[11] Patent Number: 4,603,302
[45] Date of Patent: Jul. 29, 1986

[54] FREQUENCY MODULATION DETECTORS

[75] Inventor: Rodney J. Lawton, Wiltshire, England

[73] Assignee: Plessey Overseas Limited, Ilford, England

[21] Appl. No.: 679,872

[22] Filed: Dec. 10, 1984

[30] Foreign Application Priority Data

Dec. 9, 1983 [GB] United Kingdom ............... 8332897
Jul. 27, 1984 [GB] United Kingdom ............... 8419176

[51] Int. Cl.$^4$ ............................................. H03D 1/00
[52] U.S. Cl. ................................... 329/145; 329/137; 455/214
[58] Field of Search ............... 329/110, 126, 137, 140, 329/145; 455/214, 337; 375/80, 94

[56] References Cited

U.S. PATENT DOCUMENTS 4,288,876 9/1981 Lennox et al. .................. 455/214

FOREIGN PATENT DOCUMENTS 1063641 3/1967 United Kingdom .
1228350 4/1971 United Kingdom .
1409001 10/1975 United Kingdom .

*Primary Examiner*—Eugene R. LaRoche
*Assistant Examiner*—Robert J. Pascal
*Attorney, Agent, or Firm*—Fleit, Jacobson, Cohn & Price

[57] ABSTRACT

An FM detector comprises a frequency divider arranged to frequency divide an input FM signal and a phase sensitive detector coupled to the frequency divider. The detector receives a first frequency divided signal from a first path and receives a second frequency divided signal from a second path. The second path has a phase shift means located therein which is operative to shift the phase of the second frequency divided signal, in dependence on its frequency, relative to the phase of the first frequency divided signal. The phase sensitive detector provides an output signal corresponding to the modulation carried by the input signal.

2 Claims, 3 Drawing Figures

FREQUENCY MODULATION DETECTORS

FIELD OF THE INVENTION

This invention relates to frequency modulation (FM) detectors.

It is well known that before detection of FM signals carried by an incoming radio frequency (RF) carrier wave takes place, the RF signal is fed through a frequency translation means, for example one or more mixing circuits, so that the radio frequency (RF) can be translated down to an intermediate frequency (IF). The IF signal is then fed to an FM detector which affords a voltage output which is proportional to the FM modulation signal on the carrier wave.

DESCRIPTION OF THE PRIOR ART

A known type of FM radio receiver, which comprises three mixing circuits for the frequency translation means and a phase locked loop for the FM detector, is shown in FIG. 1 of the accompanying drawings. In FIG. 1, an aerial 1 is arranged to receive RF signals between 12 GHz and 12.4 GHz. When the FM receiver is in use, the incoming RF signal is passed to a low noise amplifier 2 where it is amplified before being fed to a mixer 3 where it is mixed with a locally generated signal from a local oscillator 4. The local oscillator provides a signal having a frequency of 11 GHz and so the mixer 3 provides a signal having a carrier frequency equal to the difference between the locally generated signal and the carrier frequency of the incoming RF signal.

The mixer 3 will also provide an output signal having a carrier frequency equal to the sum of the locally generated signal and the carrier frequency of the incoming RF signal. These two signals are fed to a band pass filter 5 which is tuned to pass only the difference signal provided by the mixer 3. Therefore, an intermediate frequency (IF) signal centred on 1 GHz is supplied by the band filter 5. The IF signal is supplied to a second mixer 6 and is mixed with a locally generated signal of 1600 MHz generated by a second local oscillator 7. A second IF signal having sum and difference components is fed from the mixer 6 to a band filter 8 which passes the difference components of the second IF signal, having a centre frequency of 600 MHz. The second IF signal is fed to a third mixer 9 where it is mixed with a signal having a frequency of 750 MHz, generated by a local oscillator 10, so as to provide a third IF signal having sum and difference components. The third IF signal is then fed to a band pass filter 11 which passes the difference IF signal (which has a centre frequency of 150 MHz). The frequency of this third IF signal is low enough for it to be fed to an FM detector 12 which produces an output voltage $V_0$ corresponding to the modulation signal carried by the incoming RF signal.

The FM detector 12 is in the form of a phase locked loop (PLL) which comprises a phase comparator 13, a loop amplifier 14 and a voltage controlled oscillator 15. The operation of such a PLL is well known.

This type of FM receiver is disadvantageous in that three mixing circuits are required in order to translate the incoming RF signal to an IF signal which is suitable for demodulation by the FM detector 12. Mixing circuits are difficult to set up because of the need to preset an oscillator in each circuit, and each circuit requires a band pass filter which introduces the possibility of image frequencies being passed. Further, it is disadvantageous to employ a phase locked loop (PLL) as an FM detector. This is because such circuits are difficult to set up and are complicated in construction.

SUMMARY OF THE INVENTION

It is an aim of the present invention to reduce the number of mixing circuits required to produce an IF signal suitable for FM detection. It is a further aim of the present invention to provide an FM detector which does not need a separate oscillator and a loop amplifier, is of more simple circuit design, and reduces the FM deviation thereby requiring the FM detector to accomodate a lower deviation signal.

According to the present invention there is provided an FM detector which comprises a frequency divider arranged to frequency divide an input FM signal, and a phase sensitive detector coupled to the frequency divider so as to receive a first frequency divided signal from a first path and to receive a second frequency divided signal from a second path having a phase shift means located therein, the phase shift means being operative to shift the phase of the second frequency divided signal, in dependence on its frequency, relative to the phase of the first frequency divided signal so as to enable the phase sensitive detector to provide an output signal corresponding to the modulation carried by the input signal.

The frequency divider may be arranged to supply the same frequency divided signal to the first path and to the second path, and the phase shift means may comprise a phase quadrature device operative to shift the phase of the second frequency divided signal by 90° relative to the first frequency divided signal, and an inductor connected in parallel with a capacitor between earth and the second path, the inductor and the capacitor being operative to shift the phase of the second frequency divided signal in dependence on its frequency.

Alternatively, the frequency divider may be arranged to supply a pair of phase quadrature related frequency divided signals, one of which is fed into the first path and the other is fed into the second path. In this case there is no phase quadrature device in the phase shift means.

Embodiments of the present invention have the advantage that at least one mixing circuit can be eliminated because the frequency of the incoming RF signal is translated down, at least in part, by the frequency divider. Such embodiments also have the advantage that the above mentioned problems associated with phase locked loops are not encountered, and the overall translating and FM detection circuitry is simplified thereby making such FM detectors more economical to manufacture. Embodiments of the present invention also have the advantage that they are eminently suitable for manufacture in integrated circuit form.

A fequency divider may have a fixed division ratio of N, for example, N=4, in which case the frequency delivered from a frequency divider is ¼ of the frequency fed into the divider.

BRIEF DESCRIPTION OF THE DRAWINGS

The invention will now be further described by way of example with reference to the accompanying drawings, in which like reference numerals designate like elements, and in which.

DETAILED DESCRIPTION OF THE DRAWINGS

Figure 1:
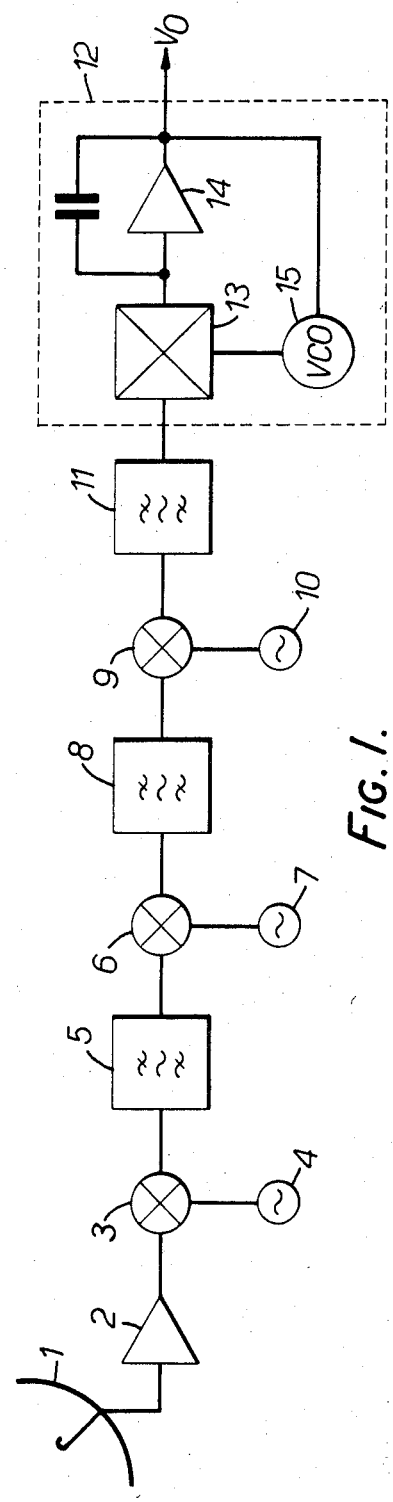
FIG. 1 shows a known type of FM receiver having an FM detector in the form of a phase locked loop.
Figure 2:
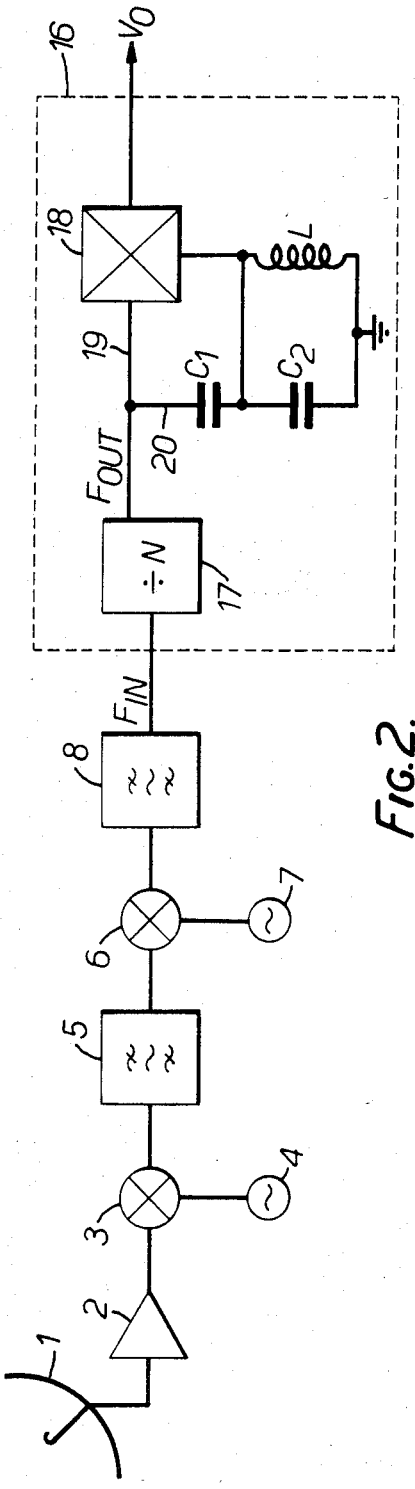
FIG. 2 shows an FM receiver having an FM detector embodying the present invention.

Referring to FIG. 2, there is shown an FM receiver which comprises the first two mixer circuits of FIG. 1 and an FM detector 16 embodying the present invention. The FM detector 16 comprises a frequency divider 17 which receives the second IF signal $F_{in}$ having a centre frequency of 600 MHz. The frequency divider 17 has a division ratio of N, where N=4 on the present example. The frequency divider 17 thus provides a frequency divided signal $F_{out}$ having a frequency of 150 MHz which is fed directly to a phase sensitive detector 18 via a first path 19, and is fed to the phase sensitive detector 18 via a second path 20. A phase shift means is located in the second path 20 and comprises a phase quadrature device which in the present example consists of a capacitor $C_1$, and a capacitor $C_2$ connected in parallel with a coil L. The capacitor $C_2$ and the coil L connect the second path 20 to earth thereby imposing a frequency delay on the signal $F_{out}$ dependent upon its frequency. The capacitor $C_1$ imposes a 90° phase shift on the signal $F_{out}$ transmitted by the second path 20. Hence, the phase sensitive detector 18 receives a first frequency divided signal over the first path 19 and a second frequency divided signal over the second path 20, the first and second signals varying in phase with respect to one another according to the frequency of the IF signal. The phase sensitive detector 18 provides an output voltage $V_0$ which is indicative of the frequency modulation content of the incoming RF signal.

Figure 3:
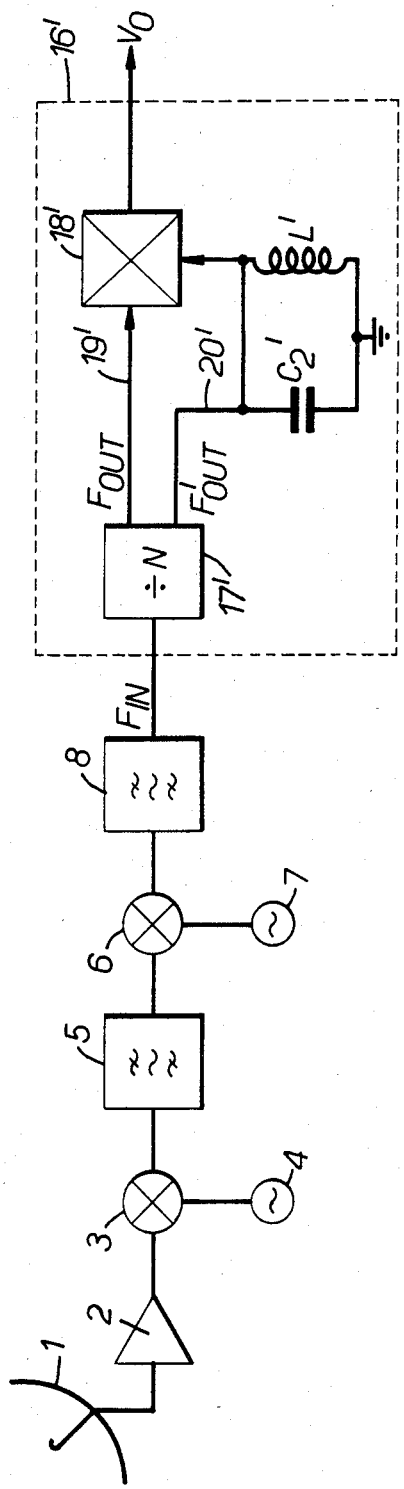
FIG. 3 shows an FM receiver having a modified FM detector embodying the present invention.

FIG. 3 shows an FM receiver having a modified FM detector 16' according to the present invention. In FIG. 3, the FM receiver provides a second IF signal $F_{in}$ having a centre frequency of 600 MHz in the same way as the FM receiver described with reference to FIG. 2. The second IF signal is fed to the FM detector 16' which comprises a frequency divider 17' having a division ratio of N where N=4 in the present example. The frequency divider 17' thus provides a pair of outputs $F_{out}$ and $F'_{out}$ each having a frequency of 150 MHz and being in phase quadrature with respect to one another. The signals $F_{out}$ and $F'_{out}$ are fed to a phase sensitive detector 18'. The $F_{out}$ signal is fed directly to the phase sensitive detector 18' via a first path 19', and the $F'_{out}$ is fed to the detector 18' via a second path 20' which path comprises a phase shift means. Th phase shift means comprises a capacitor $C'_2$ and a coil L'. The phase sensitive detector 18' performs the same function as the phase sensitive detector 18 described with reference to FIG. 2 to produce an output $V_0$ which corresponds to the modulation signal carried by the incoming RF signal.

Elimination of the phase quadrature device $C_1$ from the second path 20 facilitates a further simplification of the FM detector according to the present invention, thus making the modified FM detector particularly suitable for implementation onto an integrated circuit chip.

FM detectors embodying the present invention can be advantageously used in FM receivers designed to receive and detect FM signals which are particularly weak, for example, television signals which have been broadcast from a satellite.

I claim:

1. An FM detector comprising a frequency divider arranged to frequency divide an input FM signal and apply the same frequency divided signal to a first and a second path, and a phase sensitive detector coupled to the frequency divider so as to receive a first frequency divided signal from the first path and to receive a second frequency divided signal from the second path having a phase shift means located therein, the phase shift means being operative to shift the phase of the second frequency divided signal, in dependence on its frequency, relative to the phase of the first frequency divided signal so as to enable the phase sensitive detector to provide an output signal corresponding to the modulation carried by the input signal and the phase shift means comprises a phase quadrature device operative to shift the phase of the second frequency divided signal by 90° relative to the first frequency divided signal, and an inductor connected in parallel with a capacitor between earth and the second path, the inductor and the capacitor being operating to shift the phase of the second frequency divided signal in dependence on its frequency.

2. An FM detector comprising a frequency divider arranged to frequency divide an input FM signal, and a phase sensitive detector coupled to the frequency divider so as to receive a first frequency divided signal from a first path and to receive a second frequency divided signal from a second path having a phase shift means located therein, the phase shift means being operative to shift the phase of the second frequency divided signal, in dependence on its frequency, relative to the phase of the first frequency divided signal so as to enable the phase sensitive detector to provide an output signal corresponding to the modulation carried by the input signal wherein the frequency divider is arranged to supply a pair of phase quadrature related frequency divided signals, one of which is fed into the first path and the other is fed into the second path.

* * * * *